United States Patent [19]

Reinert

[11] 4,085,341
[45] Apr. 18, 1978

[54] INTEGRATED INJECTION LOGIC CIRCUIT HAVING REDUCED DELAY

[75] Inventor: John Robert Reinert, Mesa, Ariz.

[73] Assignee: Motorola, Inc., Schaumburg, Ill.

[21] Appl. No.: 752,484

[22] Filed: Dec. 20, 1976

[51] Int. Cl.² ................................................ H03K 19/08
[52] U.S. Cl. .................................. 307/247 R; 307/208;
307/279; 307/299 B; 307/213
[58] Field of Search .................. 307/247 R, 291, 279,
307/299 B, 208, 213

[56] References Cited

U.S. PATENT DOCUMENTS

| 3,673,434 | 6/1972 | McIntosh | 307/247 R |
| 3,947,697 | 3/1976 | Archer et al. | 307/247 R |
| 3,976,949 | 8/1976 | Hepworth et al. | 307/279 X |
| 3,993,918 | 11/1976 | Sinclair | 307/279 |

Primary Examiner—John S. Heyman
Attorney, Agent, or Firm—Joe E. Barbee

[57] ABSTRACT

An integrated injection logic storage element having a minimum delay time. Means for steering input data into the circuit are provided. These means are coupled to another means for selectively gating the input data through the circuit. The means for selectively gating is responsive to a clock pulse. A third means for providing an output storage latch and having multiple outputs is coupled to the means for selectively gating. At least one of the multiple outputs is coupled to an output of the means for selectively gating thereby providing an output which has a delay time which is less than another one of the multiple outputs which is not coupled to the means for selectively gating.

7 Claims, 3 Drawing Figures

U.S. Patent      April 18, 1978      4,085,341
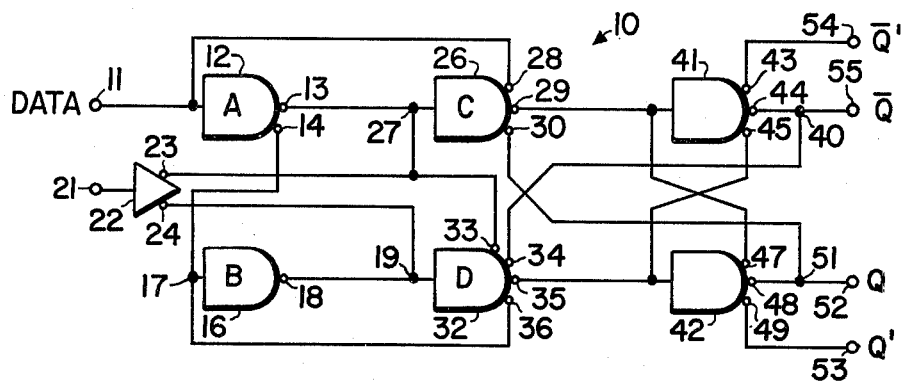
FIG. 1
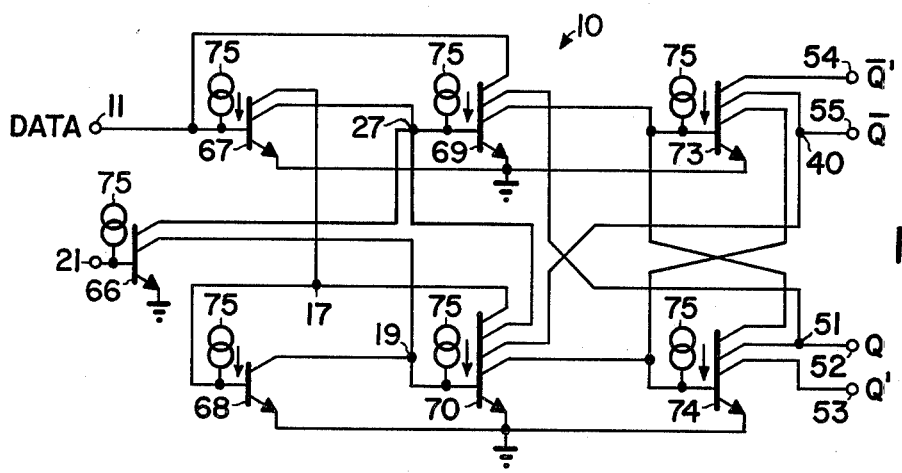
FIG. 3
FIG. 2
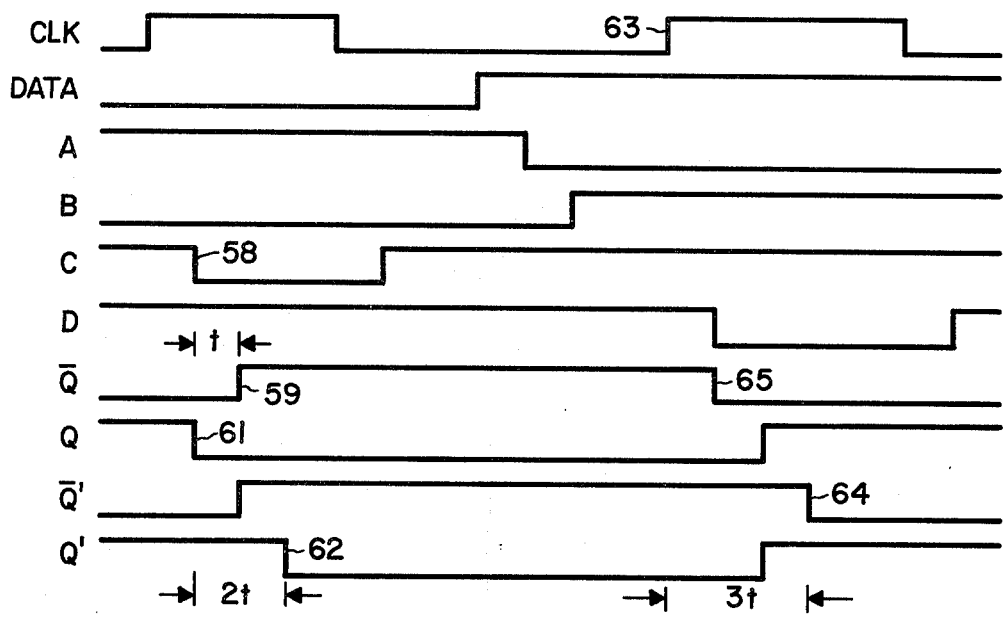

INTEGRATED INJECTION LOGIC CIRCUIT HAVING REDUCED DELAY

BACKGROUND OF THE INVENTION

This invention relates to integrated injection logic circuits, and more particularly, to integrated injection logic storage elements having a reduced delay time.

Logic circuits such as flip-flops and latches have been made in the past with discrete semiconductor components. Later the discrete components were all manufactured on one semiconductor chip thereby making an intergrated circuit. More recently however, flip-flops and latches have been manufactured using integrated injection logic processes. The upper operating frequency of these integrated injection logic circuits is sometimes limited by the propagation delay times within the circuit itself. In many applications of these integrated injection logic circuits it is desirable to operate these circuits at higher frequencies.

Accordingly, one of the objects of the present invention is to provide an improved integrated injection logic circuit.

Another object of the present invention is to provide an integrated injection logic storage element having a reduced propagation delay time.

Yet another object of the present invention is to provide an integrated logic flip-flop having a reduced delay time wherein the number of gates required for a flip-flop is not increased.

SUMMARY OF THE INVENTION

In carrying out the above and other objects of the invention in one form, there is provided an improved integrated injection logic storage element. One embodiment of the invention has means for steering input data into the circuit. This means for steering is coupled to another means for selectively gating the input data through the circuit. The means for selectively gating the input data is responsive to a clocking pulse. Means for providing an output storage latch are coupled to the means for selectively gating the input data. The means for providing the output storage latch has multiple outputs with at least one of the multiple outputs coupled to an output of the means for selectively gating thereby providing at least one output which has a delay time which can be less than another one of the outputs.

The subject matter which is regarded as the present invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 illustrates, in logic diagram form, an embodiment of the present invention as used in a flip-fop circuit;

FIG. 2 is a timing chart of the operation of the circuit of FIG. 1; and

FIG. 3 is a schematic diagram of one embodiment of the invention of FIG. 1.

The exemplifications set out herein illustrate the preferred embodiments of the invention in one form thereof, and such exemplifications are not to be construed as limiting in any manner.

DESCRIPTION OF THE PREFERRED EMBODIMENTS

In FIG. 1, D-type flip-flop 10 has an input terminal 11 for receiving input data. Input terminal 11 is connected to logic gate 12. Logic gate 12 has outputs 13 and 14 and output 14 is connected to a node 17 which goes to the input of logic gate 16. Logic gates 12 and 16 provide the function of steering data into D-type flip-flop 10. Logic gate 16 has an output 18 which is connected to a node 19. Node 19 is also connected to an output 24 of buffer 22. Buffer 22 buffers clock pulses which appear at terminal 21. Buffer 22 also has an output 23 which is connected to a node 27. Node 27 is connected to the input of logic gate 26. Logic gate 26 has outputs 28, 29, and 30 with output 28 being connected to the input of logic gate 12. Logic gate 26 works in conjunction with logic gate 32 to selectively gate data to an output storage. Logic gate 32 has four outputs 33, 34, 35, and 36 with output 36 being connected to node 17 and output 33 being connected to node 27. Nodes 17, 19, and 27 provide an AND logic function. In other words, all the inputs to the node must be a logic "1" or high in order for there to be a logic high existing past the node. Accordingly, it will be understood that the outputs 23 and 24 of buffer 22 serve to gate input data past nodes 27 and 19 respectively. Using a node as a logic AND function is readily adaptable to integrated injection logic circuits because of the ease with which it is possible to increase the number of outputs from a logic gate as will be more apparent hereinafter. Logic gates 41 and 42 serve as an output latch. Logic gate 41 has outputs 43, 44, and 45. Output 45 along with output 35 is connected to the input of logic gate 42 and output 44 is connected to a node 40. Node 40 is also connected to output 34 of logic gate 32. Output 43 goes to an output terminal 54 which is the $\overline{Q}'$ output for flip-flop 10. Node 40 goes to output terminal 55 which is the $\overline{Q}$ output of flip-flop 10. If $\overline{Q}$ or $\overline{Q}'$ is not required then, of course, its associated output terminal could be deleted. The output appearing at terminal 54 would be the normal output from a D-type flip-flop while the output appearing at terminal 55 would be the $\overline{Q}$ output having a reduced delay. Logic gate 42 has output terminals 47, 48, and 49 with output 49 going to output terminal 53 which is the Q' output of the circuit. Output 47 along with output 29 is connected to the input of logic gate 41. Output 48 is connected to node 51. Output 30 of logic gate 26 is also connected to node 51. Node 51 is connected to output terminal 52 which is the Q output of flip-flop 10 and is a terminal having an output with reduced propagation time delay. The distinguishing feature of flip-flop 10, from prior art integrated injection logic circuits, is the connection from output 30 to node 51 and the connection from output 34 to node 40. The operation of flip-flop 10 can be better understood by referring to the timing chart in FIG. 2.

In the timing chart, illustrated in FIG. 2, the upper most pulse is a clock pulse which would appear at outputs 23 and 24 of buffer 22. The data pulse which is the second pulse from the top in FIG. 2 would be the input data appearing at terminal 11. The pulses labelled A, B, C, and D are related to the logic gates 12, 16, 26, and 32 in FIG. 1 having corresponding letters. These pulses are the input pulses to the corresponding gates that would be reflected to their output. As an example, pulse A would be the output of a simple NAND gate that would have an input that logic gate 12 would have. In FIG. 2 the beginning of the data pulse appears as a low or a logic "0" while pulse A appears as a logic high which would be the case if a simple NAND gate were connected to the input of logic gate 12, then pulse A would be its output. The delay in the transition of pulse A in going from a logic high to a logic low after the data pulse has switched from a logic low to a logic high corresponds to the propagation time or delay of gate 12. This is illustrated again between pulses C and $\overline{Q}$ where at 58 pulse C goes from a logic high to a logic low while one $t$ time later pulse $\overline{Q}$ goes from a logic low to a logic high at 59. This time $t$ corresponds to the propagation time of one of the logic gates. Pulse Q which would appear at output terminal 52 has a transition occurring at 61 which, as will be noted, when compared to Q', which appears at output terminal 53, occurs $2t$ times prior to the Q' output transition occurring at 62. This means that the output Q appearing at output terminal 52 has two less gate delays than does output Q' appearing at output terminal 53. This illustrates the decreased delay of improved D-type flip-fop 10. A comparison can also be made of $\overline{Q}$ output appearing at output terminal 55 and $\overline{Q}'$ output appearing at output terminal 54. Here, once again, the $\overline{Q}$ output transition 65 occurs $2t$ times prior to the $\overline{Q}'$ output transition 64. If we look at transition 63 in the clock pulse it can be seen that the $\overline{Q}$ output also had a transition at 65 one $t$ time later while transition 64 of $\overline{Q}'$ occurs $3t$ times after transition 63. And this is of course an improvement of $2t$ times over the normal output $\overline{Q}'$ of D-type flip-flop 10. It will be noted that when comparing the Q output to the Q' output and when comparing the $\overline{Q}$ output to the $\overline{Q}'$ output that there is no decrease in delay time when an output changes from low to high, however, there is a $2t$ time decrease when an output changes from high to low. In other words, a high to low transition in the output will occur $2t$ times sooner when using an output with reduced delay (Q or $\overline{Q}$) as compared to the normal output (Q' or $\overline{Q}'$).

Of course it will be understood by those skilled in the art that D-type flip-flop 10 of FIG. 1 can be used as a frequency divider by connecting output 55 to input terminal 11. Of course it will be appreciated that the invention as illustrated in FIG. 1 can be applied to a latch circuit in the same manner as it is used in flip-flop 10, thereby decreasing the delay time of the latch. In a latch circuit, the two central logic gates that perform the function of selectively gating data to the output storage are omitted and the clock pulses are fed into the first two gates. Thus the function of selectively gating input data is combined with the steering function performed by the first two gates.

FIG. 3 is a schematic representation of an embodiment of the invention of FIG. 1. Transistor 67 receives the input data from data terminal 11 and has two collectors which correspond to outputs 13 and 14. One collector of transistor 67 is connected to node 17 which is also connected to the base of a transistor 68. Transistor 68 has one collector corresponding to output 18 (of FIG. 1) which is connected to node 19. Transistors 69 and 70 correspond to logic gates 26 and 32 respectively and comprise a means for selectively gating data to an output storage. Transistor 69 has three collector outputs and transistor 70 has four collector outputs. Those persons skilled in the art will recognize that the number of outputs of an integrated injection logic (I²L) transistor can be increased by simply adding more collector regions for a given transistor in an integrated injection logic semiconductor chip. Transistors 69 and 70 are intercoupled with output storage transistors 73 and 74. One of the collectors of transistor 70 is connected to a collector of transistor 73 to provide a reduced delay output 55. Also one of the collectors of transistor 69 is connected to one of the collectors of transistor 74 to provide a Q output 52 with reduced delay. Transistor 66 serves as the buffer for the clock input signals appearing at terminal 21. It will be noted that each one of the transistors in FIG. 3 has a current source 75 connected to its base. This provides the base drive for the transistors. In a typical integrated injection logic circuit, current source 75 can be a PNP transistor with a grounded base and its collector connected to the base of the transistor to which it is supplying current. The normal or conventional output terminals 53 and 54 are denoted as the Q' and $\overline{Q}'$ outputs respectively indicating that these outputs are now auxiliary outputs in applications where it is desired to use outputs 52 and 55 as a primary output to take advantage of the minimum propagation time delay. Outputs 52 and 55 are complements of each other, while outputs 53 and 54 are complements. All of the emitters of the transistors of FIG. 3 are connected to zero ground potential.

By now it should be appreciated that there has been provided a circuit having propagation delay from the clock input of the circuit of the circuit outputs. The decrease in propagation delay amounts to the delay for two logic gates. It should be noted that the reduced propagation delay is achieved without altering the number of gates required for a conventional D-type flip-flop and the complexity of an integrated injection logic circuit is not significantly increased. The decreased propagation delays provide for a logic circuit having the capabilities of operating at higher frequencies than heretofore achievable.

Consequently, while in accordance with the Patent Statutes, there has been described, what at present are considered to be the preferred forms of this invention, it will be obvious to those skilled in the art that numerous changes and modifications may be made herein without departing from the spirit and scope of the invention and it is therefore aimed in the following claims to cover all such modifications.

What is claimed as new and desired to secure by Letters Patents of the United States is:

1. A D-type flip-fop being interconnected to provide at least one output having a reduced time delay, comprising: means for steering input data into the flip-fop; means for selectively gating the input data through the flip-fop, the means for selectively gating being coupled to the means for steering; means for receiving a clock pulse, the means for receiving selectively controlling the means for selectively gating; and means for providing an output storage latch, the means for providing having multiple outputs and being coupled to the means for selectively gating so that at least one of the multiple outputs is coupled to an output of the means for selectively gating whereby the at least one of the multiple outputs is a combination output of the means for selectively storing and the means for providing and has a propagation delay time through the flip-flop which is less than at least one of the multiple outputs which is a direct output from the means for providing.

2. The D-type flip-fop of claim 1 wherein at least the means for providing has at least one integrated injection logic transistor, the at least one integrated injection logic transistor having more than one collector.

3. An integrated injection logic circuit having a reduced signal processing time delay, an input terminal and at least one output terminal, comprising; a first transistor having a base and a first and second collector, the base being coupled to the input terminal; a second transistor having a base and a collector, the base being connected to the first collector of the first transistor; a third transistor having a base and a first, second, and third collector, the base being coupled to the second collector of the first transistor, the first collector of the third transistor being coupled to the base of the first transistor; a fourth transistor having a base and a first, second, third, and fourth collector, the base being coupled to the collector of the second transistor, the first collector of the fourth transistor being coupled to the base of the second transistor, the second collector of the fourth transistor being coupled to the base of the third transistor; a fifth transistor having a base and a first and second collector, the base being coupled to the third collector of the third transistor, the second collector being coupled to the fourth collector of the fourth transistor, the first collector of the fifth transistor being coupled to the third collector of the fourth transistor; and a sixth transistor having a base and first and second collectors, the base being coupled to the fourth collector of the fourth transistor, the first collector being coupled to the base of the fifth transistor, the second collector being coupled to the second collector of the third transistor.

4. The circuit of claim 3 further having a clock input terminal and a seventh transistor having a base and a first and a second collector, the base being coupled to the clock input terminal, the first collector being coupled to the base of the third transistor and the second collector being coupled to the base of the fourth transistor so that the seventh transistor serves as a buffer for the clock input signal.

5. The circuit of caim 3 wherein the fifth transistor has a third collector to serve as one of the outputs for the circuit.

6. The circuit of claim 3 wherein the sixth transistor has a third collector to serve as one of the outputs for the circuit.

7. An integrated injection logic circuit having an input terminal for receiving input data and a clock terminal for receiving clock pulses which are used to clock the input data through the circuit, comprising: a first logic gate to receive the input data; at least a second logic gate to assist the first logic gate in processing the input data through the circuit, the at least a second logic gate coupled to the first logic gate; means to buffer the clock pulse appearing at the clock terminal, the means to buffer being connected to the clock terminal and coupled to the first and second logic gates; and at least two logic gates interconnected to form a storage latch and having at least one output, the at least two logic gates being coupled to the first and second logic gates, the at least one output of the at least two logic gates being coupled to the second logic gate thereby providing an output from the circuit having a reduced time delay.

* * * * *